United States Patent
Moser et al.

(10) Patent No.: US 7,340,313 B2
(45) Date of Patent: Mar. 4, 2008

(54) MONITORING DEVICE FOR MONITORING INTERNAL SIGNALS DURING INITIALIZATION OF AN ELECTRONIC CIRCUIT

(75) Inventors: Manfred Moser, Dachau (DE); Erwin Thalmann, Villach (AT); Martin Versen, Munich (DE)

(73) Assignee: Infineon Technologies AG, Munich (DE)

( * ) Notice: Subject to any disclaimer, the term of this patent is extended or adjusted under 35 U.S.C. 154(b) by 414 days.

(21) Appl. No.: 11/081,270

(22) Filed: Mar. 16, 2005

(65) Prior Publication Data

US 2005/0209715 A1   Sep. 22, 2005

(30) Foreign Application Priority Data

Mar. 18, 2004   (DE)   ............ 10 2004 013 429

(51) Int. Cl.
| | |
|---|---|
| *G05B 9/02* | (2006.01) |
| *G06G 7/70* | (2006.01) |
| *G06F 19/00* | (2006.01) |
| *G06F 13/00* | (2006.01) |
| *G06F 7/38* | (2006.01) |
| *G06F 9/00* | (2006.01) |
| *G06F 9/44* | (2006.01) |
| *G06F 15/00* | (2006.01) |
| *G06F 9/24* | (2006.01) |
| *G06F 15/177* | (2006.01) |
| *G06F 11/00* | (2006.01) |
| *G06F 17/50* | (2006.01) |

(52) U.S. Cl. ............... 700/79; 701/115; 710/31; 710/33; 712/229; 713/1; 714/37; 714/39; 716/4

(58) Field of Classification Search ........... 700/79, 700/81; 714/37, 38, 39, 47, 718; 701/1, 701/33, 102, 115; 327/334, 355, 365; 341/173; 702/57, 58, 59; 710/31, 32, 33, 61; 712/229; 713/1, 2; 716/4, 5, 12, 16

See application file for complete search history.

(56) References Cited

U.S. PATENT DOCUMENTS

| | | | | |
|---|---|---|---|---|
| 4,231,091 | A | * 10/1980 | Motz | .................. 701/102 |
| 5,774,472 | A | * 6/1998 | Matsuoka | ................. 714/718 |
| 5,826,211 | A | * 10/1998 | Kobayashi | ............... 701/115 |
| 6,134,611 | A | * 10/2000 | Ooishi | ..................... 710/61 |
| 6,356,095 | B1 | * 3/2002 | Komoriya | ................ 324/763 |
| 6,374,161 | B1 | * 4/2002 | Iwai et al. | ................... 701/1 |
| 6,771,108 | B2 | * 8/2004 | Kawasaki et al. | .......... 327/299 |

FOREIGN PATENT DOCUMENTS

| | | |
|---|---|---|
| EP | 287402 A2 | * 10/1988 |
| US | EP 0 467 719 A2 | 1/1992 |

OTHER PUBLICATIONS

German Office Action dated Jan. 17, 2005.

* cited by examiner

*Primary Examiner*—Crystal J. Barnes
(74) *Attorney, Agent, or Firm*—Jenkins, Wilson, Taylor & Hunt, P.A.

(57) ABSTRACT

The invention provides a device for monitoring electronic circuit units during an initialization phase. The device has at least one internal data line (103) for forwarding internal data (105) in the electronic circuit unit (101) and at least one data connection line (104) for outputting the internal data from the electronic circuit unit (101) and for inputting external data (106) into the electronic circuit unit (101). A changeover unit (102), which is intended to change over the data connection line (104) either to the internal data line (103) or to internal signal lines (113), and a combinational logic unit (111) for combining an initialization signal (109), which is provided by the electronic circuit unit (101) to be monitored, with an external changeover signal (108), which is supplied via a changeover signal input (107) of the electronic circuit unit (101) to be monitored, are also provided. An activation signal (114), which is output by the changeover unit (102), is used to change over the data connection line to the internal signal lines (113) when the initialization signal (109) indicates an initialization mode of the electronic circuit unit (101).

6 Claims, 1 Drawing Sheet

MONITORING DEVICE FOR MONITORING INTERNAL SIGNALS DURING INITIALIZATION OF AN ELECTRONIC CIRCUIT

TECHNICAL FIELD

The present invention relates, in general, to data interchange between electronic circuit units via data lines or data buses and relates, in particular, to a monitoring device for monitoring internal signals during initialization of an electronic circuit unit to be monitored.

BACKGROUND ART

Specifically, the present invention relates to a device for monitoring electronic circuit units, which has at least one internal data line for forwarding internal data in the electronic circuit unit to external circuit units, and at least one data connection line for outputting the internal data from the electronic circuit unit and for inputting external data from external circuit units into the electronic circuit unit.

Electronic circuit units (also referred to as electronic components or chips) perform a specified function that is preceded by a switching-on sequence or initialization, which must be complied with exactly.

So that the electronic circuit units can perform their prespecified function, the switching-on sequence or a specific initialization mode must be complied with exactly.

Read and write access operations for memory banks, for example DDR2 (Double Data Rate 2) DRAM (Dynamic Random Access Memory) memory chips, are based on bursts. DDR2 SDRAM chips must be powered up and initialized in a predefined manner. Operating procedures other than those specified may lead to an undefined operating state.

A power-up and initialization sequence takes place until the electronic circuit unit is in an idle state. On the basis of this state, it is now possible to perform or address all of the functions of the electronic circuit unit.

Specific functions, for example test mode functions, which are essentially known only to manufacturers of the electronic circuit units (chip manufacturers) can be used to change internal voltages or to record internal voltages from outside the electronic circuit unit to be monitored.

However, internal voltages and internal signals which are used in the electronic circuit unit to be monitored can be detected only after the initialization mode or the initialization procedure has taken place, that is to say that an access operation for measuring the internal voltage is effected only after a power-up and initialization procedure has taken place.

The fact that internal voltages in the electronic circuit unit to be monitored can be detected only after the initialization mode has been run through results in the fundamental drawback that the electronic circuit unit to be monitored (to be tested) cannot be analyzed or monitored in the critical power-up phase.

In many cases, however, it is important to monitor this phase, in particular, as fully as possible, since an electronic circuit unit often cannot be initialized completely.

In a case such as this, the electronic circuit unit is then not operational or not fully operational either.

SUMMARY OF THE INVENTION

Therefore, it is an object of the present invention to provide a monitoring device for electronic circuit units which makes it possible to monitor internal voltages even during the initialization mode of the electronic circuit unit to be monitored.

This object is achieved, according to the invention, by means of a device having the features of patent claim 1.

Further refinements of the invention can be found in the subclaims.

A fundamental concept of the invention is to use a changeover unit to change over internal signals to a data-connection line in the electronic circuit unit (to be monitored) during the initialization mode in such a manner that said signals can be monitored as the initialization mode is taking place.

The changeover unit for changing over the data connection unit is preferably designed in such a manner that the latter can be switched through either to an internal data line or to internal signal lines.

The changeover unit is preferably activated by an activation signal that is output by a combinational logic unit. The combinational logic unit combines an initialization signal, which is provided by the electronic circuit unit to be monitored and is generated during the initialization procedure, with an external changeover signal, which is supplied via a changeover signal input of the electronic circuit unit to be monitored.

The signals which are carried on the internal signal lines preferably include different internal signals to be monitored.

A principal advantage of the present invention is thus that it is possible to analyze internal signals during the initialization phase (during the initialization mode) of the electronic circuit unit to be monitored.

Another advantage of the inventive monitoring device is that, in addition to it being possible to measure and record signals during initialization, this function can be controlled externally and does not need to be switched on using a specific test mode.

In particular, it is expedient for the circuit extension, which is provided in the form of the changeover unit and the combinational logic unit for the electronic circuit unit to be monitored, not to affect a normal operating mode as soon as the initialization procedure has been concluded. The electronic circuit unit can be operated in line with its specification after the initialization mode has ended.

The circuit extension, which essentially comprises the changeover unit and the combinational logic unit within the electronic circuit unit to be monitored, does not affect operation of the circuit after the initialization mode has ended.

In line with one preferred embodiment of the invention, a fundamental advantage is thus that the electronic circuit unit to be monitored can be analyzed in the initialization phase.

It is now advantageously possible, when initialization cannot be concluded or when errors occur as initialization is taking place (for example as a result of power-up problems), to detect a signal profile of the internal signals externally during the initialization mode. This makes it possible to easily identify a critical range during an initialization mode of the electronic circuit unit to be monitored.

Errors of this type are, for example, incorrect timing or an incorrect internal voltage level of one or more internal signals to be monitored.

The inventive device for monitoring electronic circuit units essentially has:

a) at least one internal data line for forwarding internal data in the electronic circuit unit to external circuit units; and b) at least one data connection line for outputting the internal data from the electronic circuit unit and for inputting external data into the electronic circuit unit, with a changeover unit, which is connected to the data connection unit and is intended to change over the data connection line either to the internal data line or to internal signal lines, and a combinational logic unit for combining an initialization signal, which is provided by the electronic circuit unit to be monitored, with an external changeover signal, which is supplied via a changeover signal input of the electronic circuit unit to be monitored, and for outputting an activation signal to the changeover unit also being provided. The changeover unit, which has been activated by the activation signal, can be used to switch the data connection unit to the internal signal lines when the initialization signal indicates an initialization mode of the electronic circuit unit to be monitored.

The subclaims contain advantageous developments and improvements of the respective subject matter of the invention.

In line with one preferred development of the present invention, the changeover unit, which has been activated by the activation signal, is used to switch the data connection line to the internal signal lines when both the initialization signal indicates an initialization mode of the electronic circuit unit to be monitored and the external changeover signal, which is supplied via the changeover signal input of the electronic circuit unit to be monitored, indicates a monitoring mode.

In line with yet another preferred development of the present invention, the combinational logic unit is in the form of an AND gate.

In line with yet another preferred development of the present invention, the initialization signal, which is provided by the electronic circuit unit to be monitored, is prescribed by a timer in the electronic circuit unit, said timer prescribing the end of the initialization mode on the basis of a predetermined period of time.

In line with yet another preferred development of the present invention, the initialization signal, which is provided by the electronic circuit unit to be monitored, is prescribed using internal signals in the electronic circuit unit, which internal signals have a predetermined state during the initialization mode.

In line with yet another preferred development of the present invention, an external address bus is used to supply the external changeover signal.

One exemplary embodiment of the invention is shown in the drawing and will be explained in more detail in the description that follows.

DETAILED DESCRIPTION OF THE INVENTION

Figure 1:
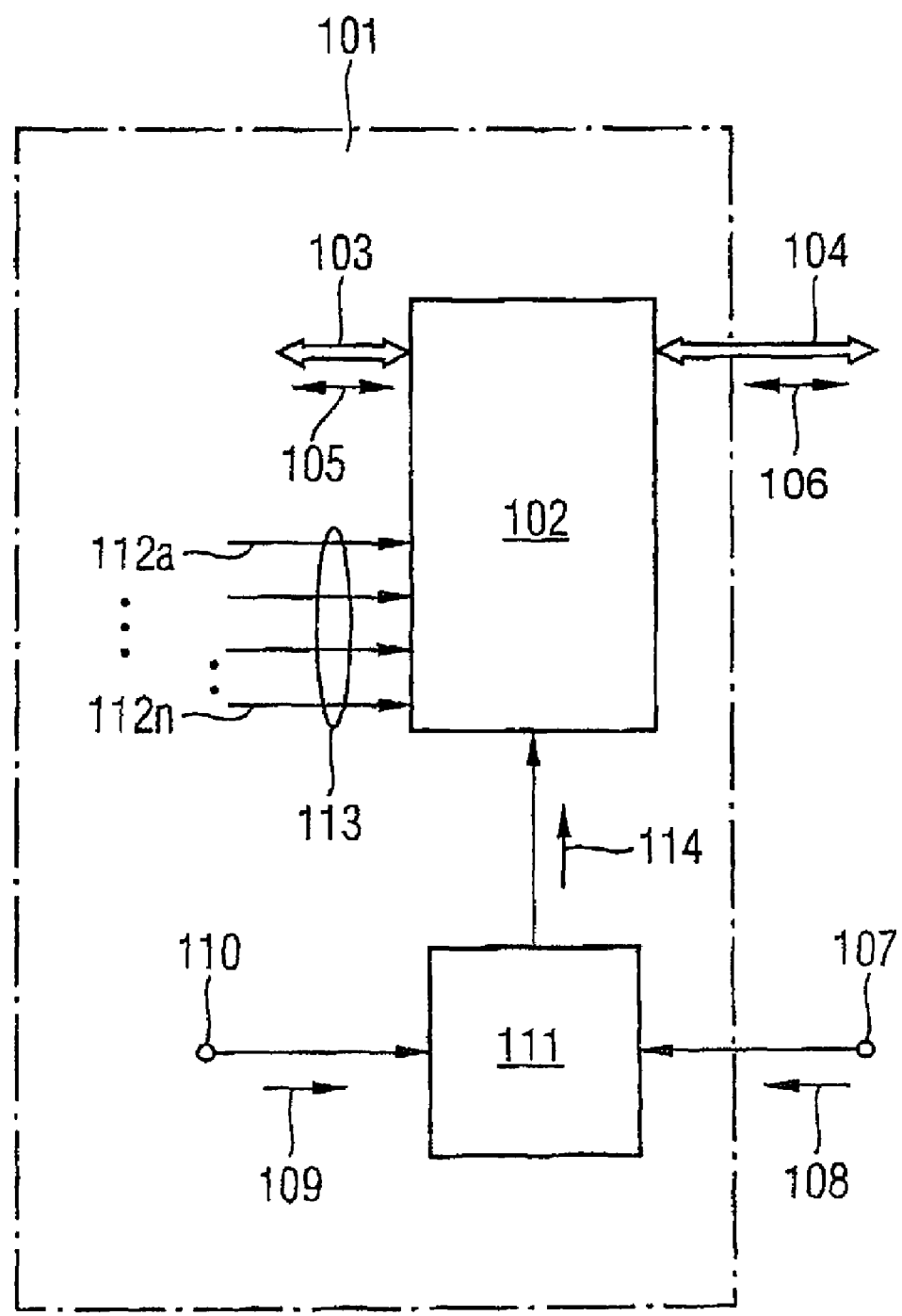
FIG. 1 schematically shows a block diagram of an electronic circuit unit that is to be monitored and has a changeover unit and a combinational logic unit in line with one preferred exemplary embodiment of the present invention.

FIG. 1 shows a block diagram of an inventive circuit arrangement, an electronic circuit unit 101 to be monitored having been extended, in comparison with a conventional design, by a changeover unit 102 and a combinational logic unit 111.

Signals are usually exchanged between the electronic circuit unit 101 to be monitored and other (external) electronic circuit units via appropriate data buses or data connection lines 104. This makes it possible to input external data 106 into the electronic circuit unit 101 via the at least one data connection line 104 and the internal data line 103. Internal data 105 in the electronic circuit unit 101 are also forwarded to external circuit units (not shown) via the internal data line 103 and the at least one data connection line 104.

After an initialization phase (initialization mode), the internal data line 103 and the data connection line 104 are connected to one another and are designed to interchange data.

According to the invention, internal signals 112a-112n to be monitored become switchable to the at least one data connection line 104 during the initialization phase. The changeover unit 102 carries out a changeover operation of this type. The internal signals 112a-112n (where n can be any desired number of signals to be monitored) to be monitored are supplied to the changeover unit 102 on internal signal lines 113.

An activation signal 114, which causes the changeover unit 102 to change over the internal signal lines 113 to the at least one data connection line 104 when an initialization mode of the electronic circuit unit to be monitored is being run through, is also supplied to the changeover unit 102.

This makes it possible to detect, measure and monitor the internal signals 112a-112n using the existing data connection line 104.

The internal signals 112a-112n can also be recorded during the initialization procedure, thus simplifying a subsequent error search. As soon as the electronic circuit unit to be monitored has been initialized completely, the changeover unit 102 changes over the at least one data connection line 104 to the internal data line 103, so that, in the normal operating mode, internal data 105 can be routed to external circuit units (not shown) via the internal data line 103 and the data connection line 104, and, on the other hand, external data 106 originating from the external circuit units can be routed, via the data connection line 104 and the internal data line 103, to internal units in the electronic circuit unit to be monitored.

The text below will explain how the activation signal 114 is generated using the combinational logic unit 111. As illustrated in FIG. 1, both an initialization signal 109 and an external changeover signal 108 are supplied to the combinational logic unit 111.

In line with the preferred exemplary embodiment of the present invention, the combinational logic unit 111 is provided in the form of an AND gate. The initialization signal 109 is supplied to the combinational logic unit ill via an initialization signal input 110 (internal input of the electronic circuit unit 101 to be monitored), while the external changeover signal 108 is supplied via the changeover signal input 107 of the electronic circuit unit 101 to be monitored. The changeover signal input 107 is preferably included in an external address bus in such a manner that the external changeover signal can be supplied via the external address bus.

In the preferred exemplary embodiment, the initialization signal has a logic "1" as long as an initialization mode of the electronic circuit unit 101 to be monitored is defined. In this case, the initialization signal 109, which is provided by the electronic circuit unit 101 to be monitored, can be prescribed by a timer (not shown) within the electronic circuit unit, said timer prescribing the end of the initialization mode on the basis of a particular period of time. That is to say that initialization has been concluded in this case after a precisely defined amount of time.

It is also possible for the initialization signal 109, which is provided by the electronic circuit unit 101 to be monitored, to be obtained from internal signals in the electronic circuit unit 101, which internal signals have a predetermined state during the initialization mode. Although four internal signals 112a-112n are shown in FIG. 1, the present invention is not restricted to such a number n of signals.

ANDing by means of the combinational logic unit 111 in the form of an AND gate is used to combine the initialization signal 109 and the external changeover signal 108 to form the activation signal 114. That is to say that an activation signal 114 (logic "1") is output to the changeover unit 102 only when both the initialization signal 109 and the external changeover signal 108 have a logic "1".

This makes it possible to activate the new functional feature of the electronic circuit unit 101 from outside the electronic circuit unit 101 to be monitored.

If an external changeover signal 108 having a logic "1" is prescribed at the changeover signal input 107, the internal signals 112a-112n, which are to be monitored and are provided on the internal signal lines 113, are changed over, as described in detail above, to the at least one data connection line 104, so that the internal signals 112a-112n are externally available for monitoring, recording and measuring purposes during the initialization mode.

The circuit extension of the electronic circuit unit 101, which extension is provided in the form of the changeover unit 102 and the combinational logic unit 111, does not affect a normal operating mode, that is to say an operating mode after the initialization mode has taken place, that is to say that the electronic circuit unit 101 can be operated in line with its specification after initialization.

Although the present invention has been described above with reference to preferred exemplary embodiments, it is not restricted thereto but rather may be modified in a wide variety of ways.

The invention is also not restricted to the application options mentioned.

LIST OF REFERENCE SYMBOLS

101 Electronic circuit unit
102 Changeover unit
103 Internal data line
104 Data connection line
105 Internal data
106 External data
107 Changeover signal input
108 External changeover signal
109 Initialization signal
110 Initialization signal input
111 Combinational logic unit
112a-112n Internal signals to be monitored
113 Internal signal lines
114 Activation signal

What is claimed is:

1. Device for monitoring an electronic circuit unit, having:
    a) at least one internal data line for forwarding internal data in the electronic circuit unit to external circuit units; and
    b) at least one data connection line for outputting the internal data from the electronic circuit unit and for inputting external data, which are provided by external circuit units, into the electronic circuit unit, wherein
the device for monitoring an electronic circuit unit also has:
    c) a changeover unit, which is connected to the data connection line and is intended to change over the data connection line either to the internal data line or to internal signal lines; and
    d) a combinational logic unit for combining an initialization signal, which is provided by the electronic circuit unit to be monitored, with an external changeover signal, which is supplied via a changeover signal input of the electronic circuit unit to be monitored, and for outputting an activation signal to the changeover unit,
    e) it being possible to use the changeover unit, which has been activated by the activation signal, to switch the data connection line to the internal signal lines when the initialization signal indicates an initialization mode of the electronic circuit unit to be monitored.

2. Device according to claim 1, wherein the changeover unit, which has been activated by the activation signal, is used to switch the data connection line to the internal signal lines when both the initialization signal indicates an initialization mode of the electronic circuit unit to be monitored and the external changeover signal, which is supplied via the changeover signal input of the electronic circuit unit to be monitored, indicates a monitoring mode.

3. Device according to claim 1 wherein the combinational logic unit is provided in the form of an AND gate.

4. Device according to claim 1 wherein the initialization signal, which is provided by the electronic circuit unit to be monitored, is prescribed by a timer in the electronic circuit unit, said timer prescribing the end of the initialization mode on the basis of a predetermined period of time.

5. Device according to claim 1 wherein the initialization signal, which is provided by the electronic circuit unit to be monitored, is prescribed using internal signals in the electronic circuit unit, which internal signals have a predetermined state during the initialization mode.

6. Device according to claim 1 wherein an external address bus is used to supply the external changeover.

* * * * *